United States Patent
Huang et al.

(10) Patent No.: US 9,564,353 B2
(45) Date of Patent: Feb. 7, 2017

(54) FINFETS WITH REDUCED PARASITIC CAPACITANCE AND METHODS OF FORMING THE SAME

(71) Applicant: Taiwan Semiconductor Manufacturing Company, Ltd., Hsin-Chu (TW)

(72) Inventors: Yu-Lien Huang, Jhubei (TW); Kun-Yen Lu, Longtan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/763,242

(22) Filed: Feb. 8, 2013

(65) Prior Publication Data

US 2014/0225219 A1    Aug. 14, 2014

(51) Int. Cl.
*H01L 29/76* (2006.01)
*H01L 21/762* (2006.01)
*H01L 29/06* (2006.01)
*H01L 29/66* (2006.01)
*H01L 29/78* (2006.01)

(52) U.S. Cl.
CPC ....... *H01L 21/76232* (2013.01); *H01L 21/762* (2013.01); *H01L 21/76224* (2013.01); *H01L 29/0649* (2013.01); *H01L 29/66795* (2013.01); *H01L 29/785* (2013.01)

(58) Field of Classification Search
CPC .... H01L 29/0649; H01L 21/76; H01L 21/762; H01L 21/76224

USPC .......................................... 257/395–397, 510
See application file for complete search history.

(56) References Cited

U.S. PATENT DOCUMENTS

| | | | |
|---|---|---|---|
| 6,452,246 B1 * | 9/2002 | Komori | H01L 21/76232 257/374 |
| 6,784,077 B1 * | 8/2004 | Lin et al. | 438/426 |
| 7,037,803 B2 * | 5/2006 | Inoue et al. | 438/424 |
| 7,973,344 B2 * | 7/2011 | Banna | 257/256 |
| 2004/0099906 A1 | 5/2004 | Ji et al. | |
| 2010/0090290 A1 * | 4/2010 | Sheen | H01L 29/66795 257/401 |

(Continued)

FOREIGN PATENT DOCUMENTS

| | | |
|---|---|---|
| CN | 102054741 A | 5/2011 |
| JP | 2011097057 | 5/2011 |

(Continued)

*Primary Examiner* — Matthew E Warren
(74) *Attorney, Agent, or Firm* — Slater Matsil, LLP

(57) ABSTRACT

An integrated circuit structure includes a semiconductor substrate, a semiconductor strip over a portion of the semiconductor substrate, and a Shallow Trench Isolation (STI) region on a side of the semiconductor strip. The STI region includes a dielectric layer, which includes a sidewall portion on a sidewall of the semiconductor strip and a bottom portion. The dielectric layer has a first etching rate when etched using a diluted HF solution. The STI region further includes a dielectric region over the bottom portion of the dielectric layer. The dielectric region has an edge contacting an edge of the sidewall portion of the dielectric layer. The dielectric region has a second etching rate when etched using the diluted HF solution, wherein the second etching rate is smaller than the first etching rate.

20 Claims, 16 Drawing Sheets

(56) References Cited

U.S. PATENT DOCUMENTS

2011/0097889 A1* 4/2011 Yuan .................. H01L 21/76224
 438/595

FOREIGN PATENT DOCUMENTS

| KR | 1020050087473 | 8/2005 |
| KR | 100548521 B1 | 2/2006 |

* cited by examiner

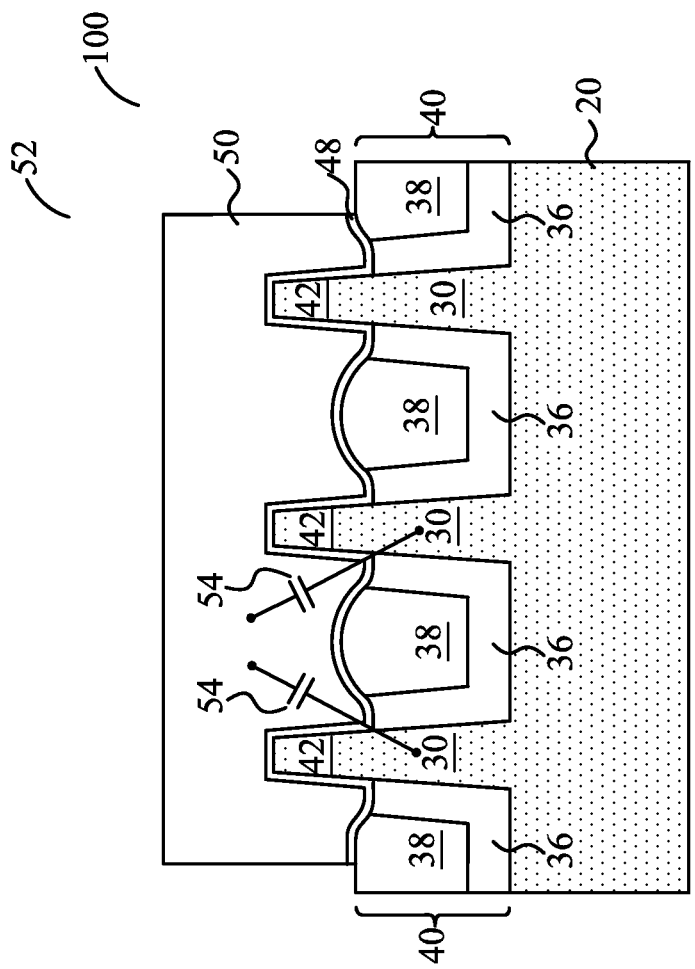

FINFETS WITH REDUCED PARASITIC CAPACITANCE AND METHODS OF FORMING THE SAME

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The Fin-FETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the formation of the FinFETs, various wet etch steps and clean steps are performed. These steps cause the recess of the top surfaces of STI regions. As a result of the wet etch steps and clean steps, the center portions of the top surfaces of the STI regions are lower than edge portions of the top surfaces of the STI regions. The STI regions with such a surface profile are known as having a (concave shape) smiling profile.

In some FinFET, there are semiconductor strips underlying the semiconductor fins. In the respective FinFETs, parasitic capacitors are formed between the gate electrodes of the FinFETs and the neighboring semiconductor strip, wherein the STI regions act as the insulators of the parasitic capacitors. The parasitic capacitance of the parasitic capacitors adversely affects the performance of the respective integrated circuit, and needs to be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Shallow Trench Isolation (STI) regions, Fin Field-Effect Transistors (FinFETs), and methods of forming the same are provided. The intermediate stages in the formation of the STI regions and the FinFETs are illustrated in accordance with exemplary embodiments. The variations of the embodiment are discussed. Throughout the various views and illustrative embodiments, like reference numbers are used to designate like elements.

Figure 1:
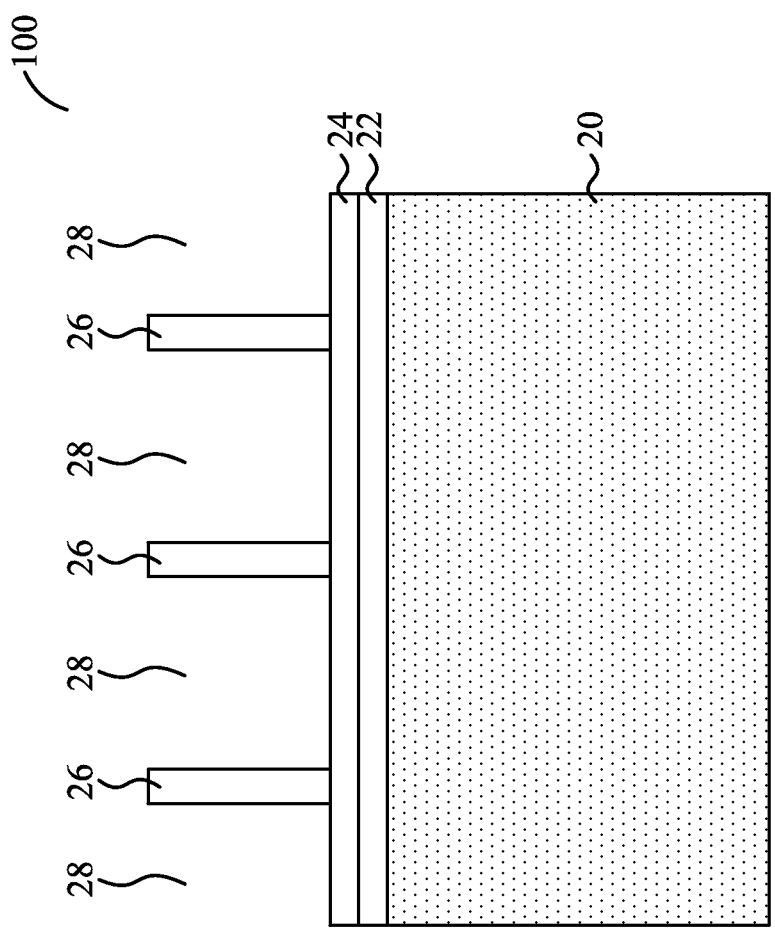
FIGS. 1 through 10C are cross-sectional views of intermediate stages in the manufacturing of Shallow Trench Isolation (STI) regions and Fin Field-Effect Transistors (FinFETs) in accordance with some exemplary embodiments.

Referring to FIG. 1, semiconductor substrate 20, which is a part of semiconductor wafer 100, is provided. In some embodiments, semiconductor substrate 20 includes crystalline silicon. Other commonly used materials, such as carbon, germanium, gallium, boron, arsenic, nitrogen, indium, and/or phosphorus, and the like, may also be included in semiconductor substrate 20. Semiconductor substrate 20 may be a bulk substrate or a Semiconductor-On-Insulator (SOI) substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 2:
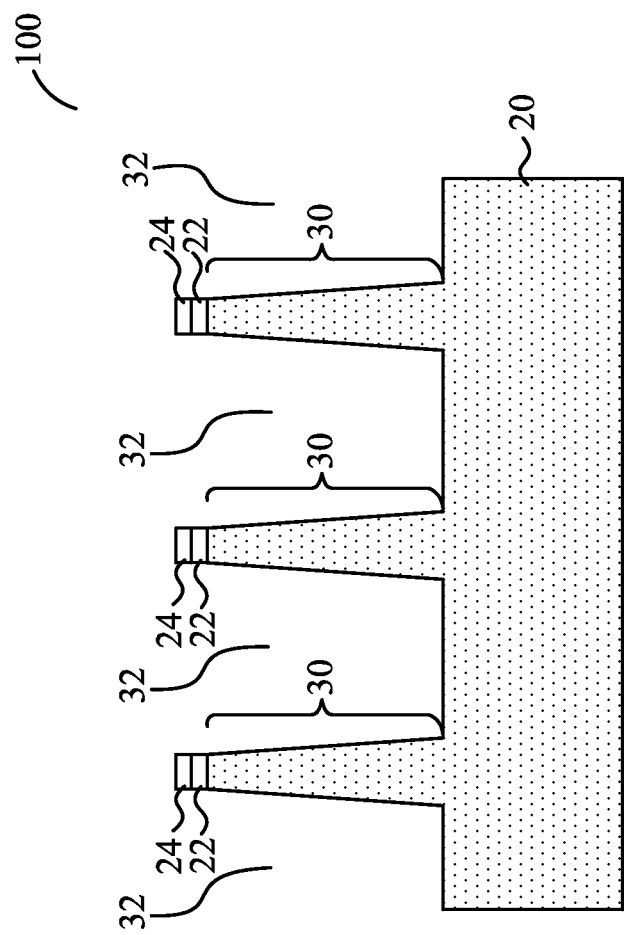

Referring to FIG. 2, mask layer 24 and pad layer 22 are etched through openings 28, exposing underlying semiconductor substrate 20. The exposed semiconductor substrate 20 is then etched, forming trenches 32. The portions of semiconductor substrate 20 between neighboring trenches 32 form semiconductor strips 30. Trenches 32 may be strips (when viewed in the top view of wafer 100) that are parallel to each other, and closely located from each other. After the etching of semiconductor substrate 20, photo resist 26 (FIG. 1) is removed. Next, a cleaning step may be performed to remove a native oxide of semiconductor substrate 20. The cleaning may be performed using diluted hydrofluoric (HF) acid, for example.

Figure 3:
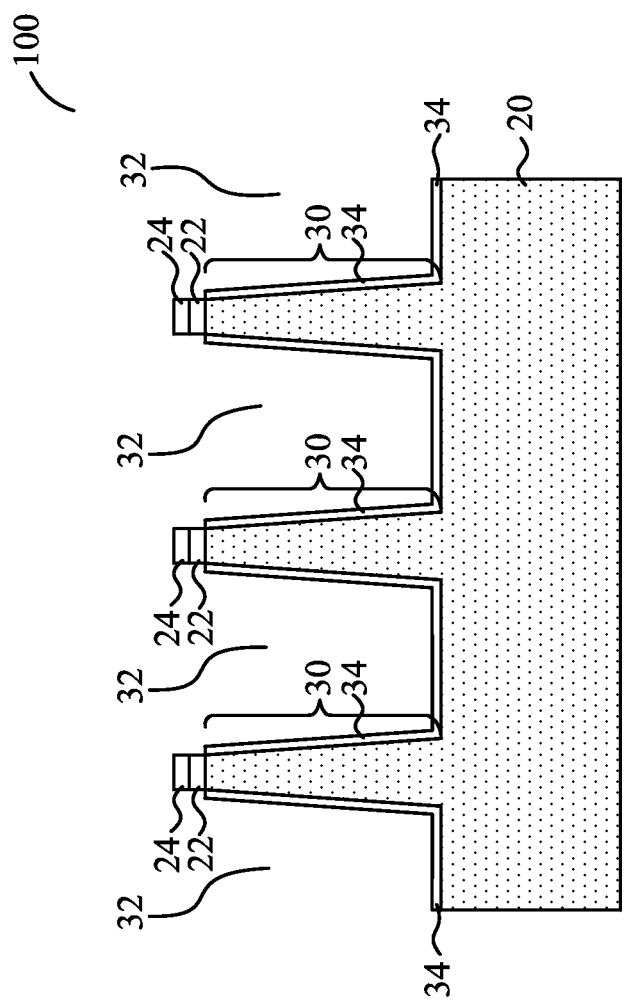

In accordance with some embodiments, liner oxide 34 is formed in trenches 32 and on the sidewalls of semiconductor strips 30, as is shown in FIG. 3. Liner oxide 34 may be a conformal layer whose horizontal portions and vertical portions have thicknesses close to each other. Liner oxide 34 may be a thermal oxide having a thickness between about 10 Å to about 100 Å. In some embodiments, liner oxide 34 is formed by oxidizing wafer 100 in an oxygen-containing environment, for example, through Local Oxidation of Silicon (LOCOS), wherein oxygen ($O_2$) may be included in the respective process gas. In other embodiments, liner oxide 34 is formed using In-Situ Steam Generation (ISSG), for example, with moisture or a combined gas of hydrogen ($H_2$) and oxygen ($O_2$) used to oxidize semiconductor strips 30. The ISSG oxidation may be performed at an elevated temperature. In yet other embodiments, liner oxide 34 may be formed using a deposition technique such as Sub Atmospheric Vapor Deposition (SACVD). The formation of liner oxide 34 may result in the rounding of the corners of trenches 32, which reduces the electrical fields of the resulting FinFET, and hence improves the performance of the resulting integrated circuit. Liner oxide 34 may comprise silicon dioxide or other dielectric materials. The density of liner oxide 34 may be between about 2.2 grams/$cm^3$ and about 2.3 grams/$cm^3$ in some embodiments. In alternative embodiments, the formation of liner oxide 34 is skipped.

Figure 4:
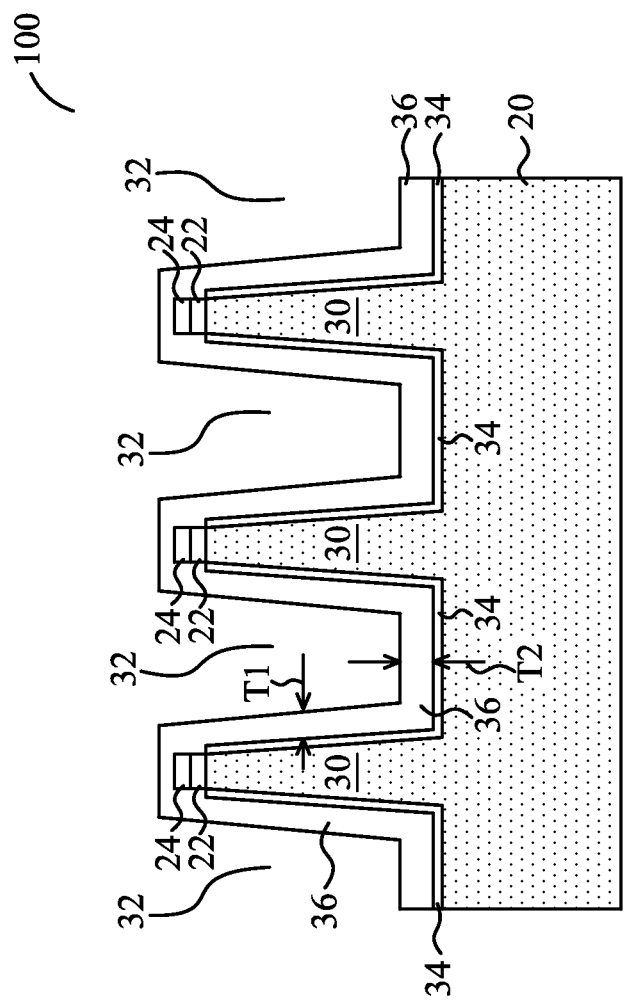

FIG. 4 illustrates the formation of dielectric layer 36. Dielectric layer 36 partially fills trenches 32, and some portions of trenches 32 remain unfilled. Dielectric layer 36 may be conformal or close to conformal, wherein thickness T1 of the vertical portions of dielectric layer 36 is close to thickness T2 of the horizontal portions of dielectric layer 36. In alternative embodiments, thickness T2 is greater than thickness T1. Furthermore, thickness T1, which may be measured at the level of the top surfaces of semiconductor strips 30, may be greater than about 5 nm, so that in subsequent process steps, STI regions 40 (FIGS. 10A, 10B, and 10C) may have a desirable top surface profile. The formation method of dielectric layer 36 may be selected from Chemical Vapor Deposition (CVD), Atomic Layer Deposition (ALD), Flowable Chemical Vapor Deposition (FCVD), and the like. In the embodiments wherein liner oxide 34 is formed, liner oxide 34 is in contact with semiconductor strip 30, and dielectric layer 36 is formed on, and contacting, liner oxide 34. In alternative embodiments, liner oxide 34 is not formed, and hence dielectric layer 36 is in contact with the sidewalls of semiconductor strips 30. FIG. 6B illustrates a structure with dielectric layer 36 contacting semiconductor strips 30.

The material of dielectric layer 36 includes, and is not limited to, a low-k dielectric material having a k value lower than about 3.0, a porous dielectric material, and the like. In some embodiments, dielectric layer 36 comprises silicon, oxygen, hydrogen, and combinations thereof. The density of dielectric layer 36 may be lower than about 2.0 grams/cm$^3$, and may be lower than the density of liner oxide 34, for example, with a density difference greater than about 0.2 grams/cm$^3$.

Figure 5:
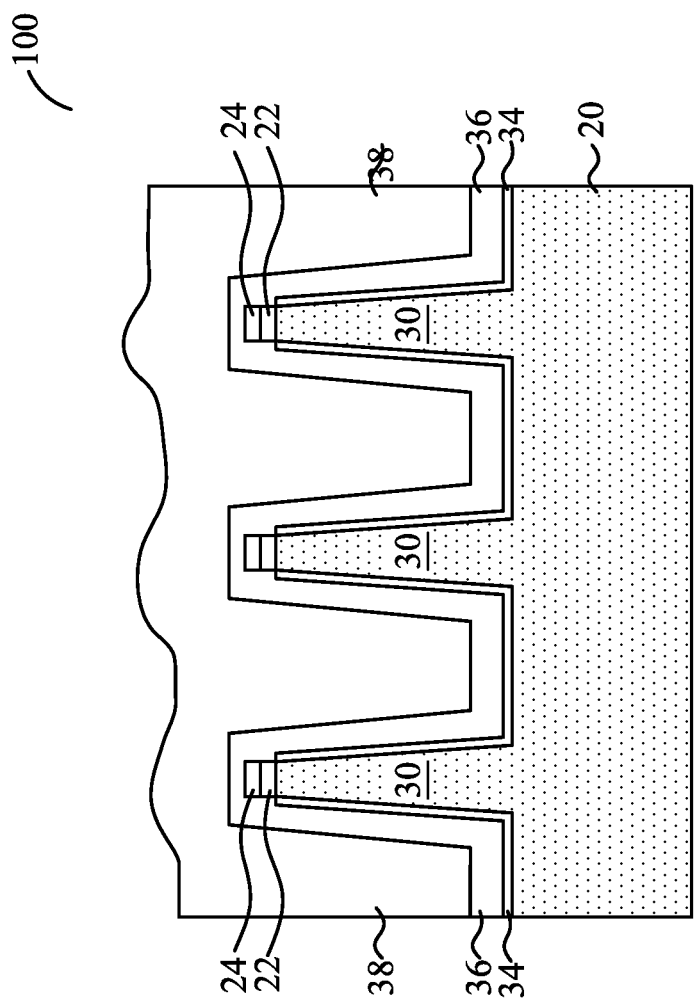

Next, referring to FIG. 5, the remaining portions of trenches 32 are filled with a dielectric material to form dielectric region 38. The top surface of dielectric region 38 is higher than the top surface of mask layer 24. Dielectric region 38 may include silicon oxide, and hence is referred to as oxide 38 hereinafter, although other dielectric materials, such as SiN, SiC, or the like, may also be used. In some embodiments, oxide 38 is formed using High Aspect-Ratio Process (HARP), High-Density Plasma CVD (HDPCVD), or the like. In the deposition of dielectric region 38, the respective process gases may include tetraethylorthosilicate (TEOS) and $O_3$ (ozone) (in the HARP process), or $SiH_4$ and $O_2$ (in the HDPCVD process).

Figure 6A:
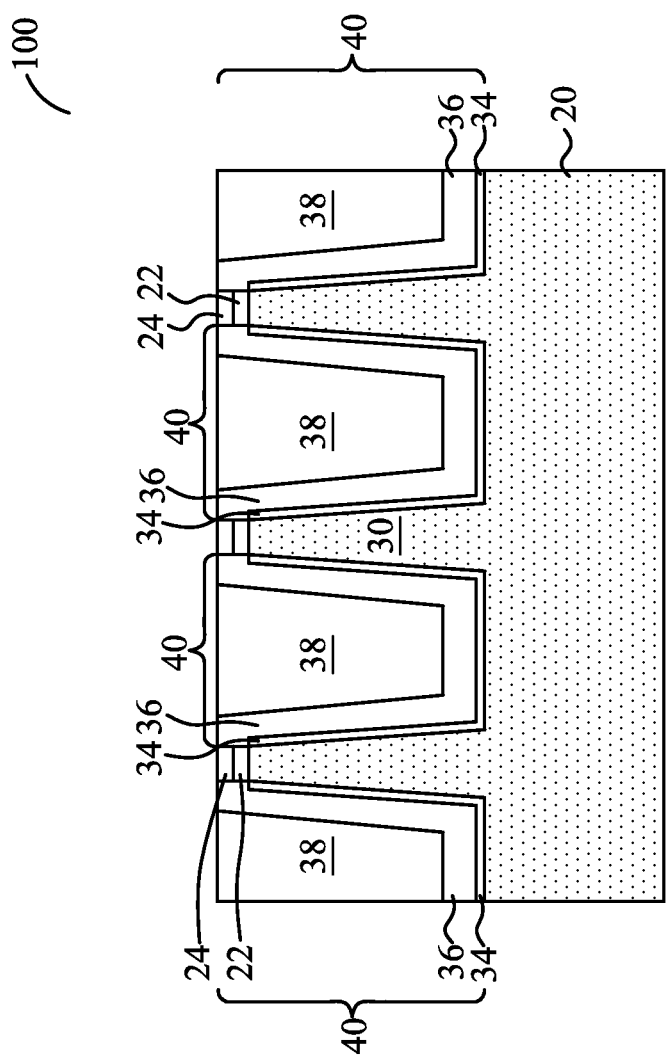
Figure 6B:
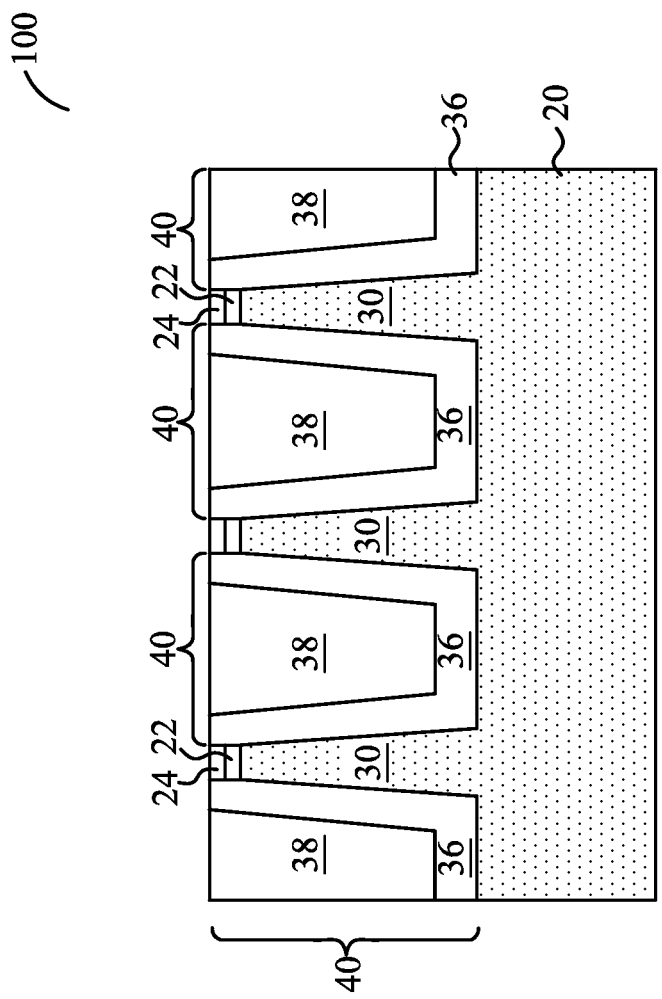

A planarization such as Chemical Mechanical Polish (CMP) is then performed, as shown in FIG. 6A, and hence STI regions 40 are formed, which include the remaining portions of liner oxide 34, dielectric layer 36, and dielectric region 38. After the CMP, dielectric layer 36 and dielectric region 38 may be separated into a plurality of discrete portions, which are referred to as dielectric layers 36 and dielectric regions 38, respectively. Mask layer 24 is used as the CMP stop layer, and hence the top surface of mask layer 24 is substantially level with the top surface of dielectric regions 38 and the top surfaces of dielectric layers 36. Furthermore, the discrete portions of liner oxide 34 are referred to as liner oxide layers 34 hereinafter. FIG. 6B illustrates wafer 100 in accordance with alternative embodiments, in which the formation of liner oxide 34 is skipped, and dielectric layers 36 are in contact with the sidewalls of semiconductor strips 30.

Figure 7:
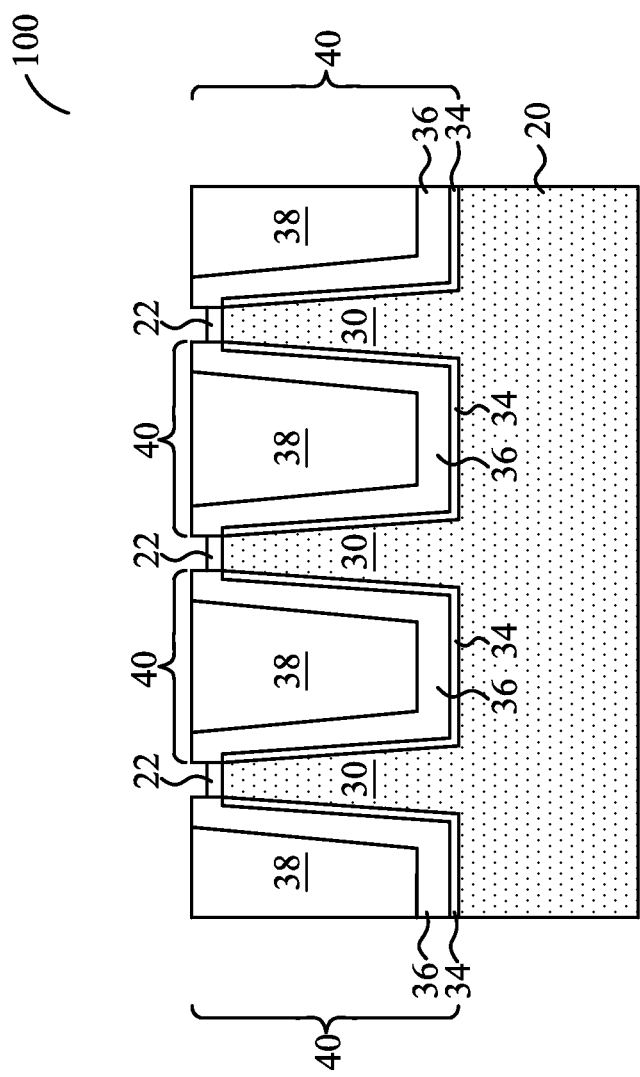
Figure 8:
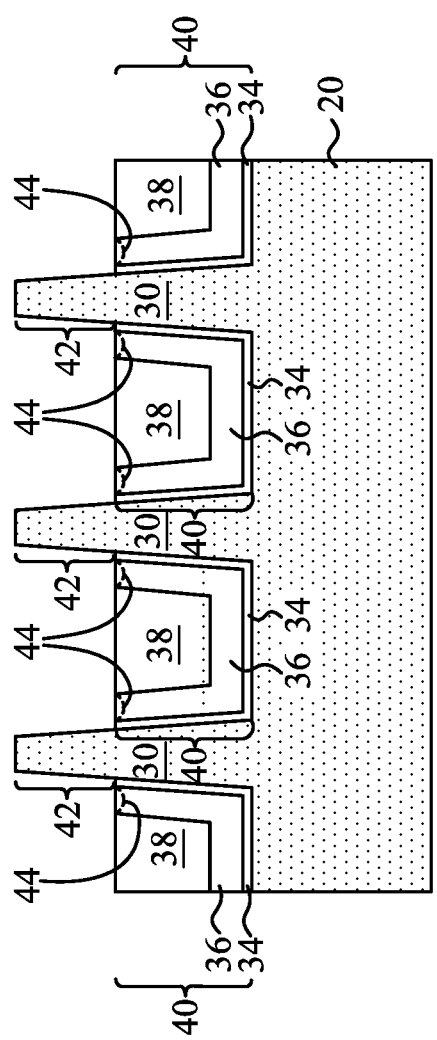

FIG. 7 illustrates the removal of mask layer 24. Mask layer 24, if formed of silicon nitride, may be removed in a wet process using hot $H_3PO_4$. Next, the structure shown in FIG. 7 is used to form semiconductor fins through the recessing of STI regions 40, and pad layer 22 is also removed, wherein the resulting structure is shown in FIG. 8. Referring to FIG. 8, the portions of semiconductor strips 30 protruding over the top surfaces of the remaining STI regions 40 become semiconductor fins 42. The recessing of STI regions 40 may be performed using a dry etch process or a wet etch process. In some embodiments, the recessing of STI regions 40 is performed using a dry etch method, in which the process gases including $NH_3$ and HF are used. In alternative embodiments, the recessing of STI regions 40 is performed using a wet etch method, in which the etchant solution includes $NF_3$ and HF. In yet other embodiments, the recessing of STI regions 40 is performed using a dilution HF solution, which may have an HF concentration lower than about 1 percent.

In the recessing of STI regions 40, liner oxide layers 34, dielectric layers 36, and dielectric regions 38 are all etched. In some embodiments, dielectric layers 36 have an etching rate E2 higher than the etching rate E1 of liner oxide layers 34 and the etching rate E3 of dielectric regions 38. When using the diluted HF solution as a reference etchant, etching rate ratio E2/E3 may be greater than about 1.2. Furthermore, etching rate ratio E2/E1 may also be greater than about 1.2 when etched by diluted HF. When other etchants are used to recess STI regions 40, the etching rate ratios E2/E1 and E2/E3 may be different from the etching rate ratios obtained by using diluted HF solution as the reference etchant. When other etchants are used to recess STI regions 40, however, etching rate ratios E2/E1 and E2/E3 may still be greater than 1.0.

As a result of the higher etching rate, the top surfaces of dielectric layers 36 may be lower than the top surfaces of dielectric regions 38. The respective top surfaces of dielectric layers 36 are schematically illustrated using dashed lines 44. In some embodiments, various approaches may be used to further recess the top surfaces of dielectric layer 36 more than the top surfaces of dielectric regions 38 and liner oxides 34. For example, fine tuning the pressure, the temperature, and/or the $NH_3$/HF gas ratio may result in more dielectric layer 36 to be etched than dielectric regions 38 and liner oxides 34, and hence result in a convex STI surface.

After STI regions 40 are recessed to form semiconductor fins 42, a plurality of process steps are formed on semiconductor fins 42, which process steps may include well implantations, dummy gate (not shown) formation and removal, a plurality of cleaning steps, and the like. Accordingly, the profile of the top surfaces of STI regions 40 is further shaped. In these process steps, chemicals are used. For example, in the cleaning steps, diluted HF or surfactant contented diluted HF may be used. These chemicals attack STI regions 40. Furthermore, dielectric layers 36, when attacked by these chemicals, are etched faster than liner oxide layers 34 and/or dielectric regions 38. The structures shown in FIGS. 9A, 9B, and 9C thus may be formed.

Figure 9A:
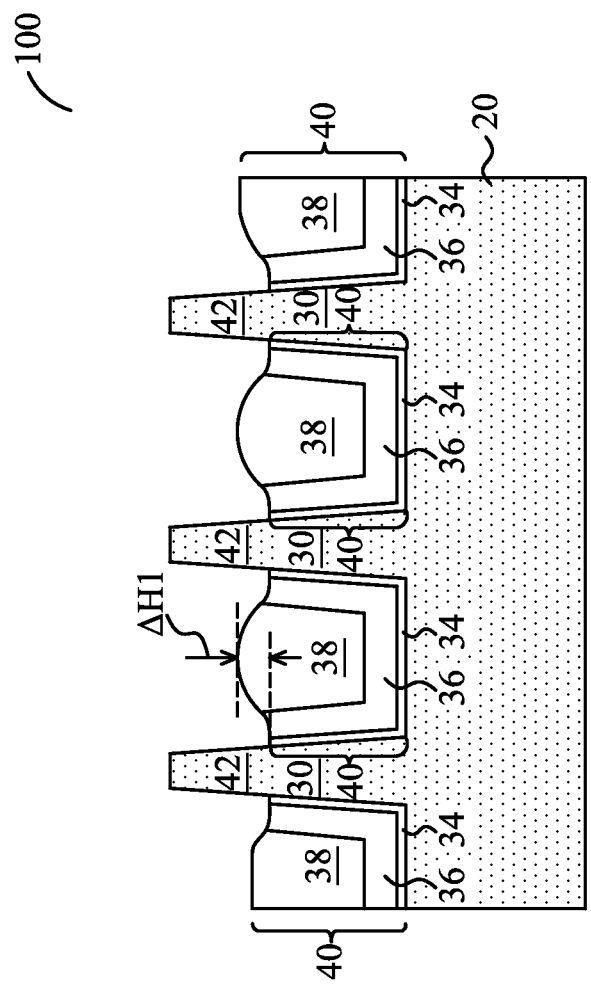

FIG. 9A illustrates one of the likely top surface profiles of STI regions 40. Since etching rate ratios E2/E1 and E2/E3 are greater than 1.0, and/or the density of dielectric layers 36 is lower than that of liner oxide layers 34 and/or dielectric regions 38, dielectric layers 36 are recessed more than liner oxide layers 34 and/or dielectric regions 38 by the chemicals. The highest point of dielectric region 38, which is between two neighboring semiconductor strips 30, is higher than the lowest point of the respective dielectric layer 36 (in the same STI region 40) by height different ΔH1, which may be greater than about 2 nm. The resulting STI regions 40 are hence referred to as having convex-shape top surfaces. In some embodiments, liner oxide layers 34 are much thinner than dielectric layers 36, and hence liner oxide layers 34 are also recessed much more than dielectric regions 38, partially due to the etching of liner oxide layers 34 from their side surfaces, which side surfaces are exposed when dielectric layers 36 are recessed. The resulting profile of the top surfaces of STI regions 40 is shown in FIG. 9A, in which the top surfaces of the sidewall portions of liner oxide layers 34 and dielectric layers 36 are substantially leveled with each other, and are lower than the top surface of the respective dielectric regions 38.

Figure 9B:
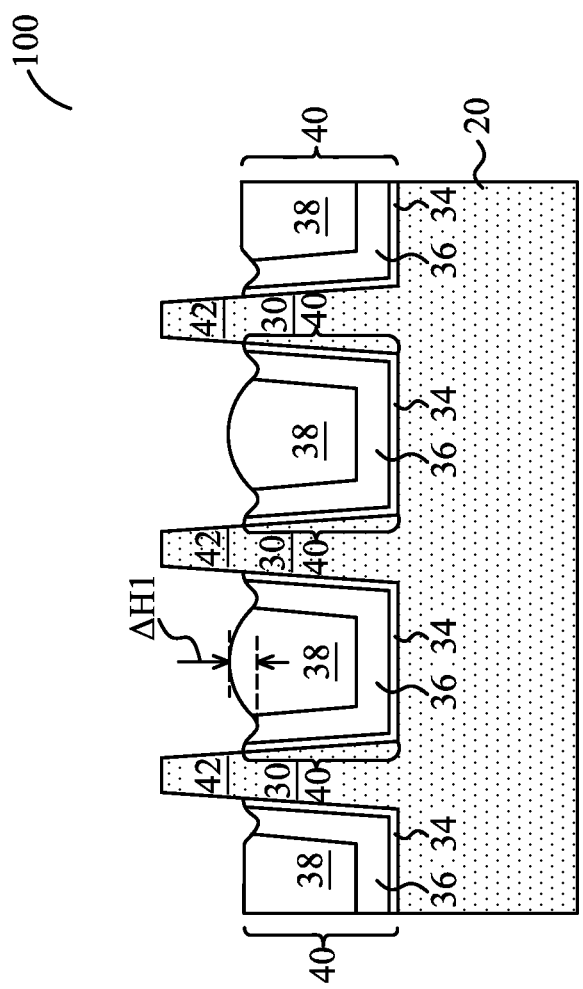

In alternative embodiments, as shown in FIG. 9B, the top surfaces of liner oxides 34 and dielectric regions 38 are both higher than that of the respective dielectric layers 36 in the same STI region 40. In some exemplary embodiments, the top surfaces of a dielectric layer 36 may have a lowest point close to the middle point that has equal distances from the respective neighboring dielectric region 38 and liner oxide layer 34. The top surface of dielectric layer 36 becomes increasingly higher in positions closer to the respective neighboring dielectric region 38 or liner oxide 34. In FIGS. 9A and 9B, each of dielectric regions 38 is over a bottom portion of a respective dielectric layer 36, and a sidewall of the dielectric region 38 is in contact with a sidewall portion of dielectric layer 36.

Figure 9C:
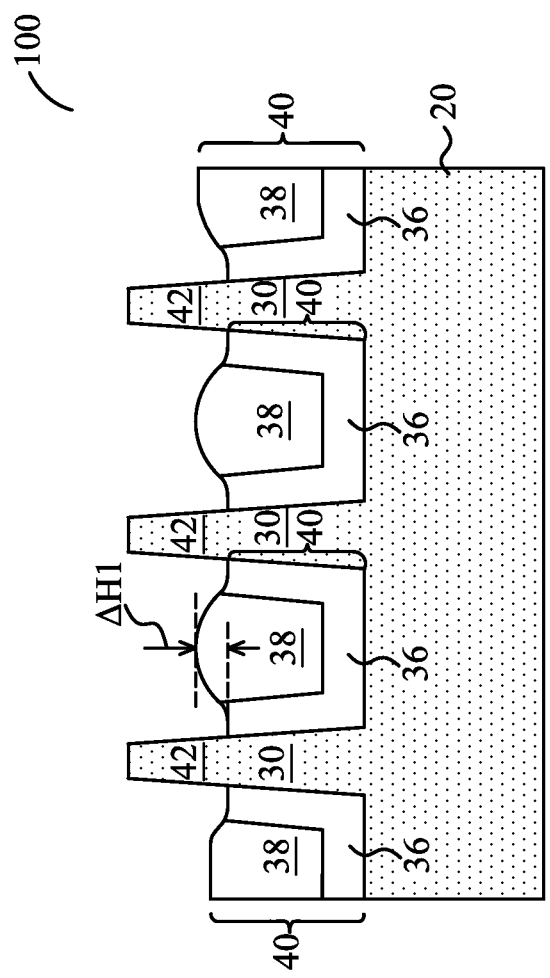

FIG. 9C illustrates wafer 100 in accordance with yet alternative embodiments, wherein no liner oxide is formed. Accordingly, the sidewall portions of dielectric layers 36 are in physical contact with the sidewalls of semiconductor strips 30. Again, the top surfaces of dielectric layers 36 are higher than the top surfaces of dielectric regions 38. In each of FIGS. 9A, 9B, and 9C, the middle portions of the top surface of dielectric regions 38 may be higher than the edge portions of the top surface of the respective dielectric regions 38.

Figure 10A:
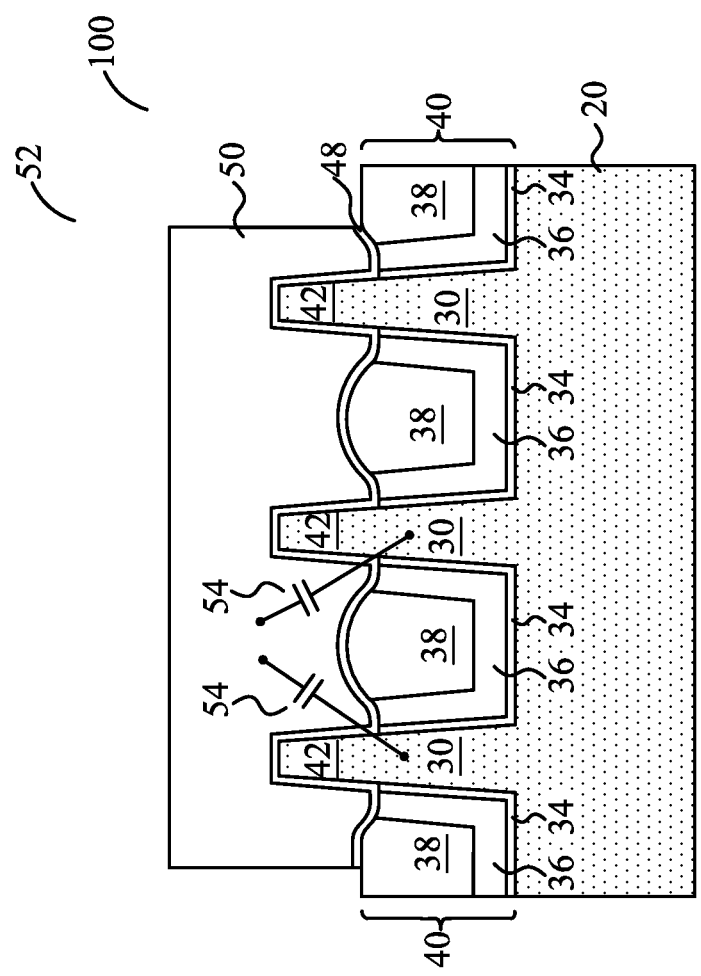
Figure 10B:
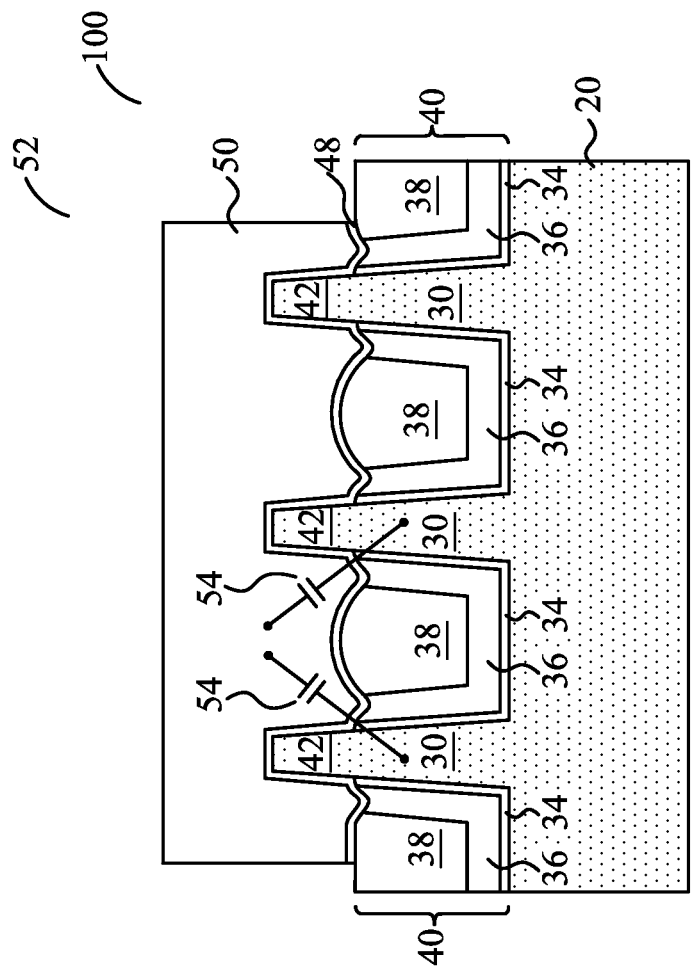

FIGS. 10A, 10B, and 10C illustrate FinFETs 52 formed from the structures shown in FIGS. 9A, 9B, and 9C, respectively. In, each of FIGS. 10A, 10B, and 10C, gate dielectric 48 is formed to cover the top surfaces and sidewalls of fins 42. Gate dielectric 48 may be formed through a thermal oxidation, and hence may include thermal silicon oxide. Alternatively, gate dielectric 48 may be formed through a deposition step, and may comprise high-k dielectric materials. Gate electrode 50 is then formed on gate dielectric 48. In some embodiments, gate electrode 50 covers more than one fin 42, so that the resulting FinFET 66 comprises more than one fin 42. In alternative embodiments, each of fins 42 may be used to form one FinFET. The remaining components of the FinFET 52, including source and drain regions and source and drain silicides (not shown), are then formed. The formation processes of these components are known in the art, and hence are not repeated herein. Gate dielectric 48 and gate electrode 50 may be formed using a gate-first approach or a gate last approach. The details of the gate-first approach or a gate last approach are not described herein.

In accordance with the embodiments of the present disclosure, by forming higher etching rate dielectric layers 36 (FIGS. 3 through 6B) before the formation of dielectric regions 38, STI regions 40 have convex shapes, and hence the parasitic capacitance, which are shown as parasitic capacitors 54 in FIGS. 10A, 10B, and 10C, are reduced compared to that in FinFETs whose STI regions have concave (smiling) profiles. Parasitic capacitors 54 are formed between gate electrode 50 and the bottom portions of semiconductor strips 30, which bottom portions are below semiconductor fins 42.

Figure 11:
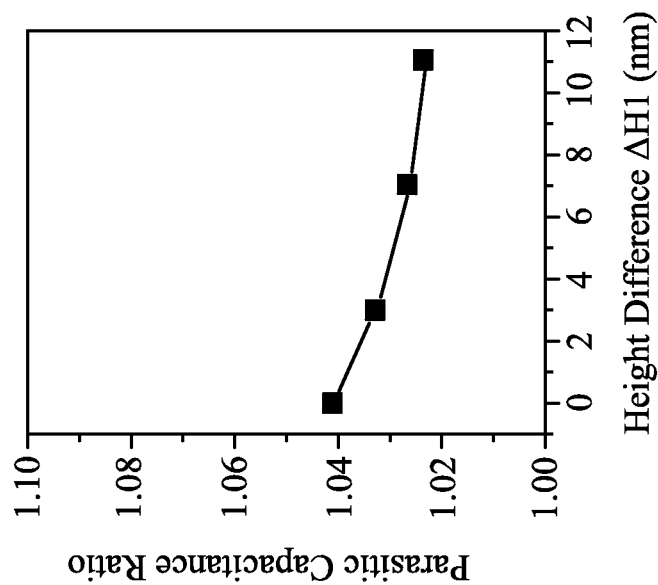
FIG. 11 illustrates parasitic capacitance ratios as a function of height differences of STI regions.

FIG. 11 illustrates simulation results, wherein parasitic capacitance ratios are illustrated as a function of height difference ΔH1 (FIGS. 9A, 9B, and 9C). The parasitic capacitance ratio is obtained by normalizing the capacitance of parasitic capacitors 54 (FIGS. 10A, 10B, and 10C) of a FinFET whose ΔH1 is greater than zero nm by the capacitance of parasitic capacitors 54 (FIGS. 10A, 10B, and 10C) of a FinFET whose ΔH1 is equal to zero nm. The results in FIG. 11 indicate that with the increase in height difference ΔH1, the parasitic capacitances are reduced.

In accordance with some embodiments, an integrated circuit structure includes a semiconductor substrate, a semiconductor strip over a portion of the semiconductor substrate, and an STI region on a side of the semiconductor strip. The STI region includes a dielectric layer, which includes a sidewall portion on a sidewall of the semiconductor strip and a bottom portion. The dielectric layer has a first etching rate when etched using a diluted HF solution. The STI region further includes a dielectric region over the bottom portion of the dielectric layer. The dielectric region has an edge contacting an edge of the sidewall portion of the dielectric layer. The dielectric region has a second etching rate when etched using the diluted HF solution, wherein the second etching rate is smaller than the first etching rate.

In accordance with other embodiments, an integrated circuit structure includes a semiconductor substrate, an opening extending into the semiconductor substrate, and a semiconductor strip on a side of the opening. The semiconductor strip is a portion of the semiconductor substrate. A liner oxide is on a bottom and sidewalls of the opening. The liner oxide includes a first sidewall portion contacting a sidewall of the semiconductor strip, and a first bottom portion. A dielectric layer is over the liner oxide and includes a second sidewall portion, and a second bottom portion overlapping the first bottom portion. A dielectric region is over the second bottom portion, with the second sidewall portion between the first sidewall portion and the dielectric region. A top surface of the second sidewall portion is lower than a top surface of the dielectric region.

In accordance with yet other embodiments, a method includes forming an opening extending from a top surface of a semiconductor substrate into the semiconductor substrate, wherein a portion of the semiconductor substrate forms a semiconductor strip exposing to the opening. A dielectric layer is formed in the opening, wherein the dielectric layer has a first etching rate when etched using a diluted HF solution. A dielectric region is formed over the dielectric layer and filling the remaining portion of the opening. The dielectric region has a second etching rate when etched using the diluted HF solution wherein the first etching rate is greater than the second etching rate. The method further includes performing a planarization to remove excess portions of the dielectric layer and the dielectric region, wherein the excess portions are over the top surface of a semiconductor substrate. The remaining portions of the dielectric layer and the dielectric region form an STI region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a semiconductor substrate;
a semiconductor strip over a portion of the semiconductor substrate;
a Shallow Trench Isolation (STI) region on a side of the semiconductor strip, wherein the STI region comprises:
a dielectric layer comprising:
a sidewall portion on a sidewall of the semiconductor strip; and
a bottom portion;
a dielectric region over the bottom portion of the dielectric layer, wherein the dielectric region comprises an edge contacting an edge of the sidewall portion of the dielectric layer, wherein a top surface of the sidewall portion of the dielectric layer comprises a middle portion, and a first portion and a second portion on opposite sides of, and joined to, the middle portion, with the middle portion being lower than the first portion and the second portion;
a liner oxide comprising a sidewall portion between, and in contact with, a sidewall of the semiconductor strip and a sidewall of the sidewall portion of the dielectric layer; and
a gate dielectric layer contacting a sidewall of the semiconductor strip.

2. The integrated circuit structure of claim 1, wherein the dielectric layer has a first density, and the dielectric region has a second density greater than the first density.

3. The integrated circuit structure of claim 1, wherein a thickness of the sidewall portion of the dielectric layer is greater than about 5 nm.

4. The integrated circuit structure of claim 1, wherein the dielectric layer comprises a low-k dielectric material having a k value lower than about 3.0.

5. The integrated circuit structure of claim 1, wherein a top portion of the semiconductor strip protrudes over a top surface of the STI region to form a semiconductor fin, and the integrated circuit structure further comprises:
a portion of the gate dielectric layer acting as a gate dielectric in contact with a sidewall of the semiconductor fin; and
a gate electrode over the gate dielectric, wherein the gate dielectric separates the semiconductor fin from the gate electrode.

6. The integrated circuit structure of claim 1, wherein the gate dielectric layer is further in contact with a top surface of the sidewall portion of the dielectric layer.

7. The integrated circuit structure of claim 1, wherein the gate dielectric layer extends from a top surface of the semiconductor strip into a divot formed of a sloped top surface of the dielectric region and a sloped top surface of the dielectric layer.

8. The integrated circuit structure of claim 1, wherein the middle portion is the lowest among the top surface of the sidewall portion of the dielectric layer.

9. An integrated circuit structure comprising:
a semiconductor substrate;
a semiconductor strip over a portion of the semiconductor substrate;
a Shallow Trench Isolation (STI) region on a side of the semiconductor strip, wherein the STI region comprises:
a dielectric layer formed of a low-k dielectric material, wherein the dielectric layer comprises:
a sidewall portion on a sidewall of the semiconductor strip, wherein the sidewall portion of the dielectric layer has a top surface having a middle portion, and two edge portions on opposite sides of, and joined to, the middle portion, and wherein the middle portion is lower than the two edge portions; and
a bottom portion;
a dielectric region over the bottom portion of the dielectric layer, wherein the dielectric region comprises an edge contacting an edge of the sidewall portion of the dielectric layer; and
a liner oxide comprising:
a sidewall portion between the semiconductor strip and the sidewall portion of the dielectric layer.

10. The integrated circuit structure of claim 9, wherein the dielectric region has an etching rate smaller than etching rates of the dielectric layer and the liner oxide when etched using a same etchant.

11. The integrated circuit structure of claim 9, wherein top surfaces of the oxide liner and the dielectric region are higher than a top surface of dielectric layer.

12. The integrated circuit structure of claim 9 further comprising a gate dielectric extending into a divot formed due to the sidewall portion of the dielectric layer recessed lower than top surfaces of the dielectric region and the sidewall portion of the liner oxide.

13. The integrated circuit structure of claim 9, wherein the dielectric layer has a first density, and the dielectric region has a second density greater than the first density.

14. The integrated circuit structure of claim 11, wherein a lowest point of a combination of the top surface of the dielectric layer, the top surface of the oxide liner, and the top surface of the dielectric region is in a middle portion of the top surface of the dielectric layer.

15. The integrated circuit structure of claim 9, wherein the low-k dielectric material has a k value lower than about 3.0.

16. The integrated circuit structure of claim 12, wherein the gate dielectric is in contact with the liner oxide, the sidewall portion of the dielectric layer, and the dielectric region.

17. An integrated circuit structure comprising:
a semiconductor substrate;
a semiconductor strip over a portion of the semiconductor substrate;
a Shallow Trench Isolation (STI) region on a side of the semiconductor strip, wherein the STI region comprises:
a dielectric layer comprising:
a sidewall portion on a sidewall of the semiconductor strip, wherein the sidewall portion of the dielectric layer has a top surface having a middle portion, and two edge portions on opposite sides of, and joined to, the middle portion, and wherein the middle portion is lower than the two edge portions; and
a bottom portion;
a dielectric region over the bottom portion of the dielectric layer, wherein the dielectric region comprises an edge contacting an edge of the sidewall portion of the dielectric layer; and
a liner oxide comprising:
a sidewall portion between the semiconductor strip and the sidewall portion of the dielectric layer; and
a bottom portion underlying the bottom portion of the dielectric layer.

18. The integrated circuit structure of claim 17, wherein the dielectric layer is formed of a low-k dielectric material, and the liner oxide and the dielectric region are formed of non-low-k dielectric materials.

19. The integrated circuit structure of claim 17, wherein all top surfaces of the sidewall portion of the dielectric layer are recessed from all top surfaces of the sidewall portion of the liner oxide and the dielectric region.

20. The integrated circuit structure of claim 17, wherein a lowest point of the top surface of the sidewall portion of the dielectric layer is close to a middle of the sidewall portion of the dielectric layer, with the middle being between opposite sidewalls of the sidewall portion of the dielectric layer.

* * * * *